(12) United States Patent
Kundaliya et al.

(10) Patent No.: US 8,921,130 B2
(45) Date of Patent: Dec. 30, 2014

(54) METHODS FOR PRODUCING AND PLACING WAVELENGTH CONVERTING STRUCTURES

(75) Inventors: Darshan Kundaliya, Beverly, MA (US); Jeffery Serre, Peabody, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 0 days.

(21) Appl. No.: 13/420,263

(22) Filed: Mar. 14, 2012

(65) Prior Publication Data

US 2013/0244354 A1    Sep. 19, 2013

(51) Int. Cl.
*H01L 33/50*    (2010.01)

(52) U.S. Cl.
CPC ............ *H01L 33/505* (2013.01); *H01L 33/502* (2013.01)
USPC ..................... 438/27; 257/E33.057

(58) Field of Classification Search
CPC ..... H01L 33/50; H01L 33/502; H01L 33/504; H01L 33/508
USPC .......................................... 438/27
See application file for complete search history.

(56) References Cited

U.S. PATENT DOCUMENTS

| | | | |
|---|---|---|---|
| 8,210,716 B2 * | 7/2012 | Lerman et al. | 362/249.02 |
| 2007/0074822 A1 * | 4/2007 | Akechi | 156/584 |
| 2010/0149816 A1 * | 6/2010 | Higashi et al. | 362/293 |
| 2010/0308361 A1 * | 12/2010 | Beeson et al. | 257/98 |
| 2011/0018011 A1 * | 1/2011 | Beeson et al. | 257/89 |
| 2011/0180804 A1 * | 7/2011 | Su et al. | 257/76 |
| 2011/0284494 A1 * | 11/2011 | Von Malm | 216/13 |
| 2012/0057219 A1 * | 3/2012 | Suyama et al. | 359/328 |

* cited by examiner

*Primary Examiner* — Michael Trinh
*Assistant Examiner* — Damian A Hillman
(74) *Attorney, Agent, or Firm* — Robert F. Clark

(57) ABSTRACT

Methods for producing and placing wavelength converting structures for use in a solid state lighting assembly are disclosed. The wavelength converting structures may take the form of thin film converters including a substrate and one or more thin films of wavelength conversion material.

15 Claims, 7 Drawing Sheets

Side View

Side View

Top View

Side View

Side View

Perspective View

METHODS FOR PRODUCING AND PLACING WAVELENGTH CONVERTING STRUCTURES

TECHNICAL FIELD

The present application relates to thin film wavelength converting structures and, more particularly, to methods for producing and placing a wavelength converting structure.

BACKGROUND

Solid state light sources such as light emitting diodes (LEDs) generate visible or non-visible light in a specific region of the electromagnetic spectrum. An LED may output light, for example, in the blue, red, green or non-visible ultraviolet (UV) or near-UV region(s) of the electromagnetic spectrum, depending on the material composition of the LED. When it is desired to construct an LED light source that produces a color different from the output color of the LED, it is known to convert the LED light output having a peak wavelength ("primary light") to light having a different peak wavelength ("secondary light") using photoluminescence.

Photoluminescence generally involves absorbing higher energy primary light by a wavelength converting material ("conversion material") such as a phosphor or mixture of phosphors. This absorption excites the conversion material to a higher energy state. When the conversion material returns to a lower energy state, it emits secondary light, generally of a longer wavelength than the primary light. The peak wavelength of the secondary light can depend on the type of phosphor material. This process may be generally referred to as "wavelength conversion." An LED combined with a wavelength converting structure that includes a conversion material such as phosphor to produce secondary light may be described as a "phosphor-converted LED" or "wavelength converted LED."

In a known configuration, an LED die such as a III-nitride die is positioned in a reflector cup package and a volume. To convert primary light to secondary light, a wavelength converting structure may be provided. The wavelength converting structure may take the form of a self supporting "plate," such as a ceramic plate or a single crystal plate. In any case, the plate may be attached directly to the LED, e.g. by wafer bonding, sintering, gluing, etc. Such a configuration may be understood as "chip level conversion" or "CLC." Alternatively, the plate may be positioned remotely from the LED. Such a configuration may be understood as "remote conversion."

Recently, interest has grown in wavelength converting structures that included one or more thin films of wavelength conversion material. While such thin film converters can be effective for converting primary light to secondary light, it can be challenging to incorporate them into existing processes for manufacturing LEDs. For example, thin film converters require the use of a substrate to support the thin film of conversion material. In many instances, few substrate options are available that can withstand high temperature processing of the conversion material. While sapphire substrates can be used, processing such substrates into a conformation that is compatible with an LED die is a challenge, particularly if the LED die includes a bond pad that requires the use of a converter including one or more curved notches. Moreover, precise placement of the conversion plate and orientation of the conversion layers relative to the LED die is often important. While such positioning can be achieved using high speed "pick and place" production, significant hard tooling and in some instances human interaction is needed to ensure that a thin film converter is properly positioned and oriented. This can increase the expense and complexity of the LED manufacturing process.

BRIEF DESCRIPTION OF THE DRAWINGS

Reference should be made to the following detailed description which should be read in conjunction with the following figures.

DETAILED DESCRIPTION

As used herein, the terms "about" and "substantially," when used in connection with a numerical value or range, mean +/−5% of the recited numerical value or range.

From time to time, one or more aspects of the present disclosure may be described using a numerical range. Unless otherwise indicated herein, any recited range should be interpreted as including any iterative values between indicated endpoints, as if such iterative values were expressly recited. Such ranges should also be interpreted as including any and all ranges falling within or between such iterative values and/or recited endpoints, as if such ranges were expressly recited herein.

One aspect of the present disclosure relates to wavelength converting structures for solid state light sources, such as light emitting diodes (LEDS). Generally, such wavelength converting structures include conversion material that is capable of absorbing primary light emitted by a light emitting surface of an LED assembly, and emitting secondary light. Although any type of wavelength converting structure may be used (e.g., a ceramic wavelength conversion plate), non-limiting preferred embodiments of the present disclosure utilize a wavelength converting structure in the form of a plate that includes one or more thin-films of conversion material. For the sake of clarity, such a wavelength converting structure is referred to herein as a "thin film converter."

Figure 1A:
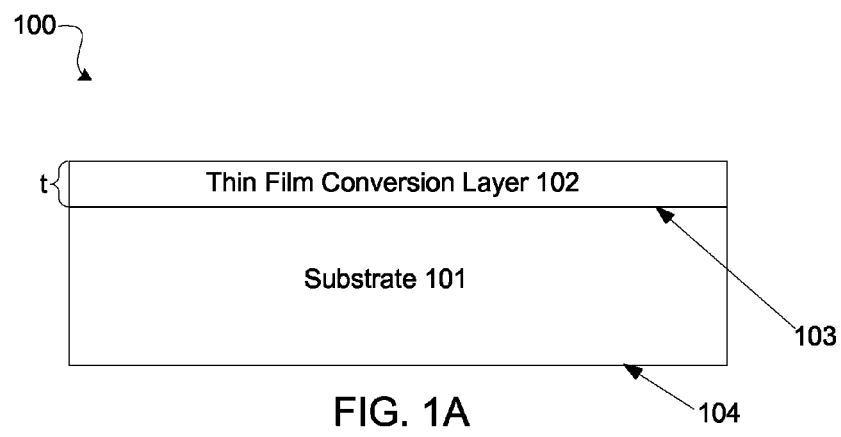
FIG. 1A is a side view of an exemplary thin film converter in accordance with the present disclosure.
Figure 1B:
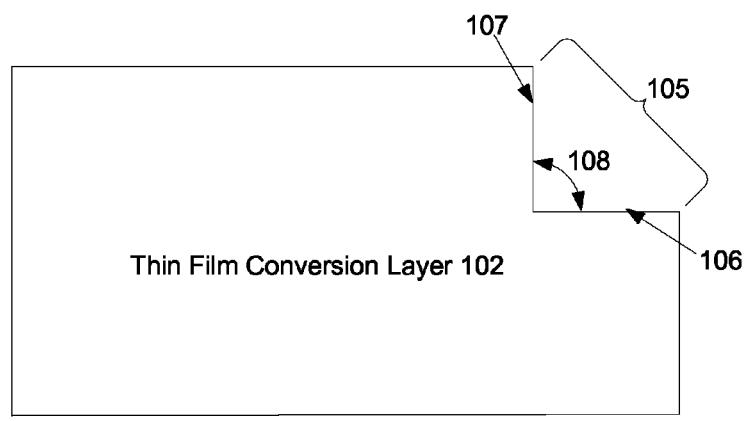
FIG. 1B is a top view of an exemplary thin film converter in accordance with the present disclosure.
Figure 1C:
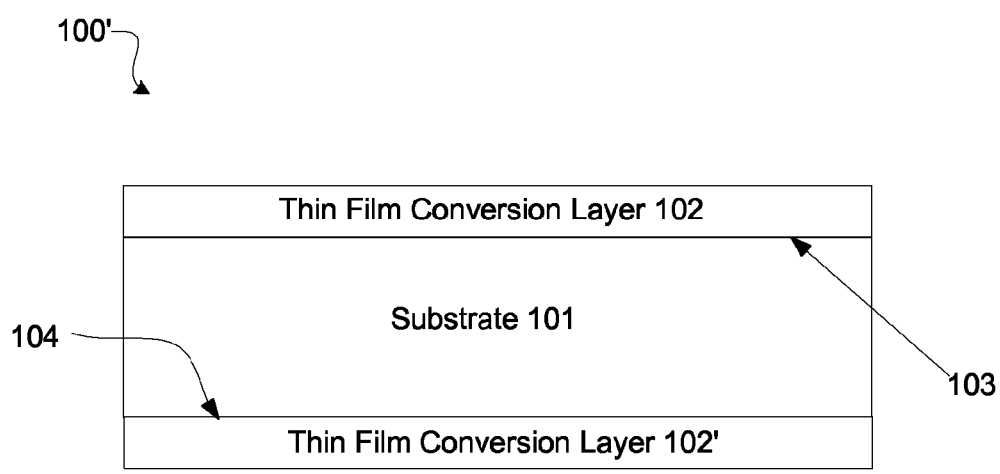
FIG. 1C is a side view of another exemplary thin film converter in accordance with the present disclosure.

FIGS. 1A and 1B provide side and top down views of an exemplary thin film converter in accordance with the present disclosure. As shown, thin film converter 100 includes substrate 101. Substrate 101 includes a top surface 103 and a bottom surface 104, either of which may support one or more thin films of conversion material. For the sake of illustration, FIGS. 1A depicts substrate 101 as supporting a single thin film conversion layer 102 on its top surface 103. It should be understood, however, that any number of thin film conversion layers may be used, and such conversion layers may be present on either or both of the top surface 103 and bottom surface 104 of substrate 101. In particular, FIG. 1C shows a side view of thin film converter 100' having a thin film conversion layer 102' on bottom surface 104.

Substrate 101 may be formed of any material that provides a stable structure upon which thin film conversion layer 102 may be deposited. Without limitation, substrate 101 may be constructed using monocrystalline or polycrystalline materials formed into a rigid plate structure using known ceramic, thin film deposition or crystal growth methods. Non-limiting examples of useful monocrystalline substrate materials include YAG (yttrium aluminum garnet), e.g., YAG(100), and sapphire, e.g., c-sapphire (0001) and r-sapphire. Non-limiting examples of useful polycrystalline substrate materials include YAG, alumina ($Al_2O_3$), and AlN. Of course, such materials are exemplary only, and substrate 101 may be formed of other monocrystalline or polycrystalline materials (e.g., GaN), as may be known to those skilled in the art. In some embodiments, substrate 101 is formed from materials that are at least partially transparent to incident primary light and/or secondary light.

Thin film conversion layer 102 may be formed by depositing one or more wavelength conversion materials on substrate 101. Any number of processes may be used to perform such deposition, including but not limited to physical vapor deposition, chemical vapor deposition, epitaxy, sputtering, pulsed laser deposition, crystal growth, electrophoretic deposition or another deposition technique. Any conversion material or combination of conversion material may be used to form thin film conversion layer 102. Suitable conversion materials include but are not limited to known phosphors for achieving desired wavelength conversion, such as oxide garnet phosphors and oxynitride phosphors. In some embodiments, thin film conversion layer 102 is formed from cerium-doped garnets such as $Y_3Al_5O_{12}:Ce^{3+}$, $Lu_3Al_5O_{12}:Ce^{3+}$, $Tb_3Al_5O_{12}:Ce^{3+}$; nitrides such as $M_2Si_5N_8:Eu^{2+}$, wherein M=Ca,Sr,Ba; oxynitrides such as $MSi_2O_2N_2:Eu^{2+}$, wherein M=Ca, Sr, Ba; and/or silicates such as $BaMgSi_4O_{10}:Eu^{2+}$ and $M_2SiO_4:Eu^{2+}$, wherein M=Ca,Ba,Sr. Thin film conversion layer 102 can also include or be formed from one or more of the following materials: $MAlSiN_3:Eu$, MS:Eu, wherein M is a metal selected from Ca, Sr, Ba; $A_2O_3:Eu,Bi$ and A is selected from Sc, Y, La, Gd, Lu; other tertiary and higher metal oxides doped with divalent or trivalent europium, including functional groups like molybdates, niobates or tungstates. Of course, other conversion materials that may be known to those of skill in the art may also be used to form thin film conversion layer 102.

Thickness is one factor that can affect the amount of amount of primary light that may be converted by thin film conversion layer 102. Accordingly, thickness t of thin film conversion layer 102 may be selected to achieve a desired amount of wavelength conversion. In some embodiments, thickness t ranges from about 10 nm (nanometers) to about 20 μm (micrometers), such as about 50 nm to about 20 μm, about 500 nm to about 20 μm, or even about 1 μm to about 5 μm.

As shown in FIG. 1B, thin film converter 100 may include notch 105. Notch 105 may be useful to determine the orientation and alignment of thin-film converter 100 during processes for manufacturing or otherwise assembling a solid state lighting device. Moreover, notch 105 can enable access to a corresponding bond pad of an underlying LED chip. In this way, notch 105 may permit wire bonding to such bond pads.

For the sake of illustration, notch 105 is depicted in FIG. 1B as being bounded by two substantially perpendicular edges 106, 107. As such, notch 105 may be understood as including an angle 108 in the range of about 85 to about 95°. It should be understood, however, that edges 106 and 107 need not be oriented in this manner, and that angle 108 may be of any desired value. Thus, angle 108 may range, for example, from greater than 0 to about 180°, about 10 to about 170°, about 30 to about 150°, about 45 to about 135°, about 85 to about 95°, or even about 90°.

It should also be understood that the shape of notch 105 in FIG. 1B is exemplary only, and notch 105 may have any desired shape and include any number of angles. For example, notch 105 may have a geometric (e.g., square, rectangular, wedge, etc.), curvilinear, or other shape. In any case, the shape of notch 105 may be configured to mate with a corresponding portion of a solid state lighting assembly, such as an LED assembly. In this way, notch 105 may facilitate the positioning and/or placement of thin film converter 100, relative to a light emitting surface of a solid state lighting device such as an LED. Of course, more than one notch may be formed in thin film converter 100. For example, in instances where an LED includes multiple bond pads, thin film converters including a corresponding number (e.g., 2, 3, 4, 5, etc.) notches may be used. Such notch(es) may have a shape that corresponds to the bond pad(s) of the underlying LED. Although multiple notches may be formed having the same shape or configuration, different notches may be formed in the same converter, as may be determined by the shape and/or configuration of the bond pads of the LED.

While thin film converter 100 is depicted in FIGS. 1A and 1B as including thin film conversion layer 102 bonded with a surface of substrate 101, other configurations are also possible. For example, thin film converter may be configured such that substrate 101 may be separated or otherwise removed from thin film conversion layer 102 after thin film converter has been appropriately placed in a solid state lighting assembly. Removal of the substrate may occur via a mechanical process, a laser lift-off process, or another process known in the art, e.g., as associated with so-called "flip chip" technology. In such instances, only thin film conversion layer 102 may remain in the LED assembly (e.g., over a light emitting surface of the LED) once the substrate is removed.

As may be appreciated, thin film converter 100 may be employed in a wavelength solid state lighting assembly to convert primary light to secondary light of a desired wavelength. To accomplish this purpose, thin film converter may be attached or otherwise positioned relative to a light emitting surface of the assembly, such as the light emitting surface of an LED. That is, thin film converter may be used in "chip level conversion" ("CLC") and "remote phosphor conversion" ("RPC") configurations.

Figure 2A:
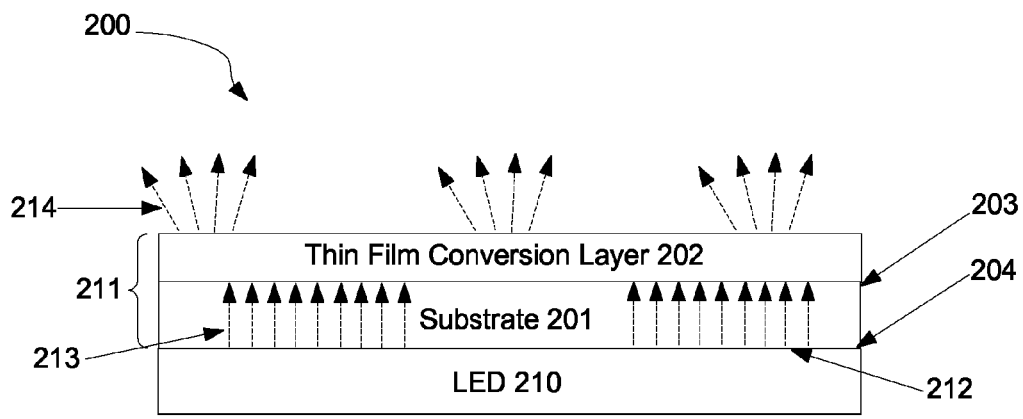
FIG. 2A is a side view of an exemplary solid state lighting assembly including a thin film converter in accordance with the present disclosure.
Figure 2B:
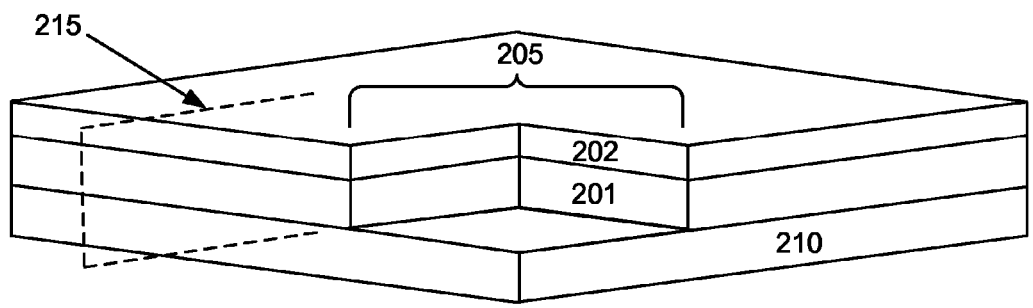
FIG. 2B is a perspective view of an exemplary solid state lighting assembly including a thin film converter in accordance with the present disclosure.

FIGS. 2A and 2B provide side and perspective views of an exemplary solid state lighting assembly that includes a thin film converter abutting the light emitting surface of an LED, i.e. as in a CLC configuration. As shown in FIG. 2A, assembly 200 includes LED 210 and a wavelength converting structure 211 consistent with the present disclosure. LED 210 may be any known LED, including but not limited to a nitride III-V LED such as an InGaN LED. LED 210 emits primary light at a peak wavelength from light emitting surface 212 thereof. In some embodiments, LED 210 is a blue LED that emits visible light in the blue region of the electromagnetic spectrum.

Wavelength converting structure 211 includes substrate 201. Substrate 201 has top and bottom surfaces 203, 204, respectively. In this non-limiting example, thin film conversion layer 202 is deposited on top surface 203 of substrate 201. Bottom surface 204 of substrate 201 is bonded to or otherwise abuts light emitting surface 212 of the LED 210. It should be understood that FIG. 2A is provided in diagrammatic form for ease of illustration and explanation and, for example, wavelength converting structure could be oriented such that thin film conversion layer 202 is bonded to or otherwise abuts light emitting surface 212 of LED 210. Likewise, multiple thin film conversion layers may be used, and may be placed on either or both of top surface 203 and bottom surface 204, as previously described in connection with FIGS. 1A and 1B.

Generally, primary light, e.g., as indicated by arrows 213, is emitted from light emitting surface 212 of LED 210 and passes through the bottom surface 204 of substrate 201 to excite conversion material in thin film conversion layer 202. In response, such conversion material emits secondary light, e.g. as indicated by arrows 214. Secondary light 214 (and in some cases, also some of primary light 213) is emitted from upper (and in some cases, side) surfaces (not labeled) of thin film conversion layer 202.

As shown in FIG. 2B, wavelength converting structure 211 may be generally configured to cover the entirety of light emitting surface 212 of LED 210. Wavelength converting structure 211 may also include notch 205. Although not required, notch 205 may be configured to have substantially the same size and shape as a corresponding notch or post in LED 210 (including light emitting surface 212) or an LED package containing LED 210. As may be appreciated notch 205 may, alone or in combination with corresponding features of LED 210, facilitate the alignment and/or orientation of wavelength converting structure 211.

For example, the position of notch 205 relative to a known plane (e.g., plane 215 in FIG. 2B) can provide a ready indication of the orientation of wavelength converting structure 211. In instances where thin film conversion layer 202 is deposited only on one side of substrate 201 or where different thin film conversion layers are deposited on both sides of substrate 201, the position of notch 205 relative to a known plane may also provide a ready indication of which side of wavelength converting structure 211 (and the corresponding thin film conversion layer 202, if present) is proximate to light emitting surface 212, and which side is distal to light emitting surface 212. This can eliminate the need to manually verify (e.g., via microscope inspection) the correct orientation of thin film conversion layer(s) 202 relative to light emitting surface 212. As a result, the positioning and placement of wavelength converting structure 211 within assembly 200 may be fully automated, e.g., with conventional "pick and place" machinery, such as surface mount technology (SMT) component placement systems known in the art.

Another aspect of the present disclosure relates to methods of making the wavelength converting structures described herein. In this regard, reference is made to FIGS. 3 and 4, which provide a block flow diagram (FIG. 3) and an illustration (FIG. 4) of one exemplary method in accordance with the present disclosure.

Figure 3:
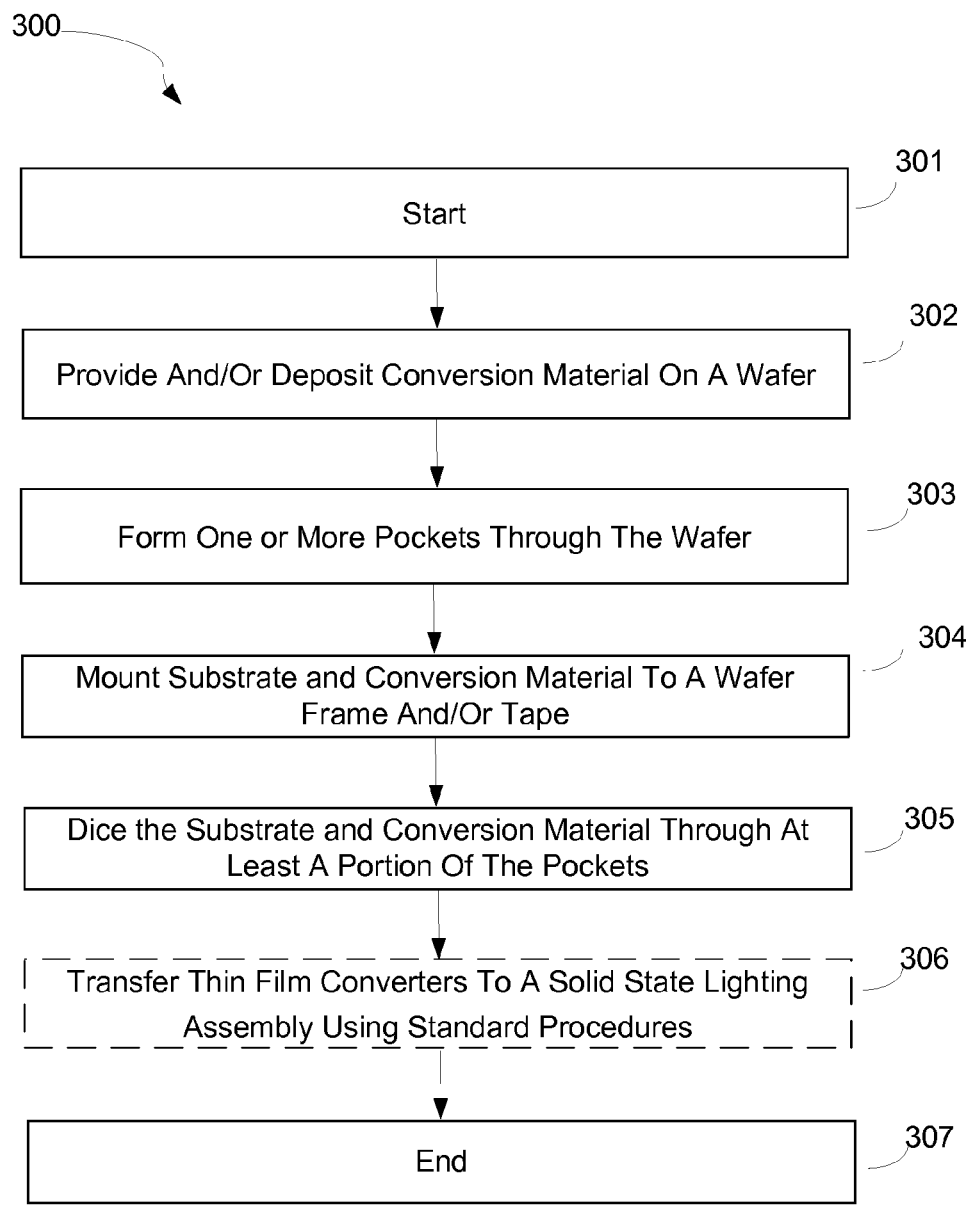
FIG. 3 is a block flow diagram of an exemplary method in accordance with the present disclosure.

As shown in FIG. 3, the method 300 begins at block 301. At block 302 (element 402 in FIG. 4), a wavelength conversion plate (hereafter called a "wafer") including a substrate and one or more thin film conversion layers is provided or otherwise created. Such a wafer may be produced, for example, by depositing one or more thin films of wavelength conversion material on an upper or lower surface of a wafer substrate. The wafer substrate may be of the same type as described above in connection with substrate 101 of FIGS. 1A and 1B. In some embodiments, the wafer has dimensions that are sufficiently large as to allow for the production of multiple thin film converters from a single wafer. For example, if the thin film converters to be produced have a dimension of 1 mm², the wafer provided or created in block 302 may have dimensions ranging from 5 mm² to 500 mm² or more.

Figure 4:
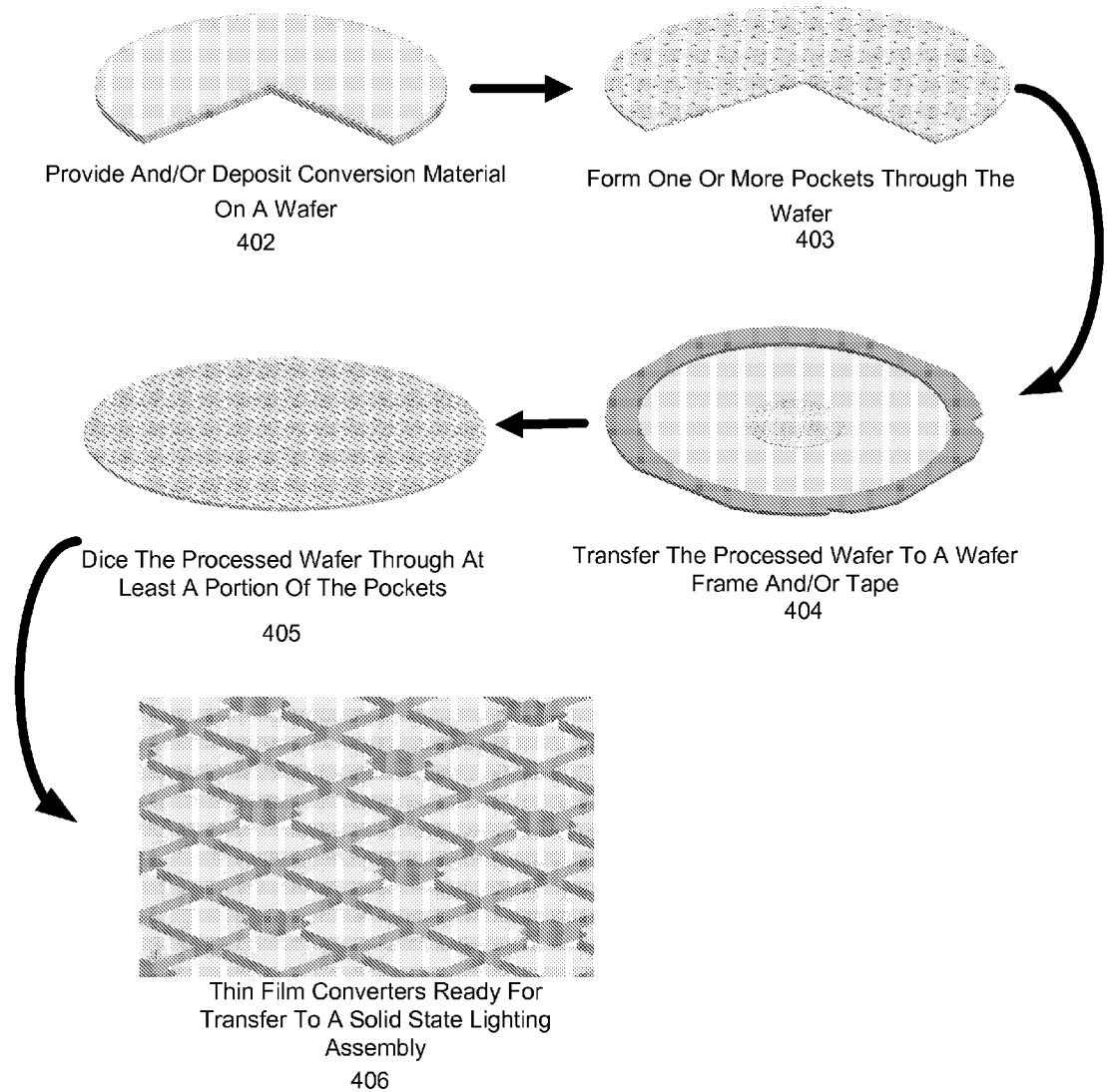
FIG. 4 diagrammatically illustrates various steps in an exemplary method in accordance with the present disclosure.

Once a wafer has been provided or is otherwise produced in accordance with block 302, the method may proceed to block 303 (illustrated as element 403 in FIG. 4). At block 303, one or more pockets may be formed in the wafer provided in block 302. In general, such pockets can take the form of one or more through holes that pass through the wafer, i.e., the thin film conversion layer(s) and wafer substrate. In some embodiments, a plurality of pockets is formed in the wafer provided in accordance with block 302. Such pockets may be produced in an ordered array or pattern, such that each pocket is positioned at a desired (e.g., equal) distance from adjacent pocket.

Pockets may be formed in the wafer in any suitable manner. For example, pockets may be formed by mechanical drilling, laser cutting, chemical etching, or another process. In non-limiting preferred embodiments, pockets are formed in the wafer by laser cutting.

The pockets formed in the wafer may be of any desired size and shape. As will become clear upon discussion of block 304, the configuration of the pockets can directly impact the size and shape of the notch formed in the wavelength converting structures produced by the methods described herein. Thus, the size and shape of the pockets may be selected based on the desired configuration of the notch. In any case, the pockets may have any geometric or irregular shape, such as but not limited to a square, rectangular, ellipsoidal, curvilinear, or other shape. In some embodiments, the pockets formed in the wafer have at least one axis of symmetry. In non-limiting preferred embodiments, the pockets include at least two axes of symmetry. In such instances, the two axes of symmetry may bisect each other at a desired angle, such as a right angle.

As one example of pockets having two bisecting axes of symmetry, reference is made to FIG. 4, wherein pockets having a square shape are formed in a wafer. As can be seen, a first axis of symmetry extends vertically through the middle of the pockets, and a second axis of symmetry extends horizontally through the pockets, bisecting the first axis of symmetry at a right or substantially right angle.

Once pockets are formed in the wafer, the process may proceed to block 304 (illustrated in element 404 of FIG. 4), wherein the processed wafer may be mounted on a tape, a wafer frame, or a combination thereof. In general, the wafer frame and/or tape can function to hold the processed wafer in place during subsequent processing. In addition, the tape can function to retain the wavelength converting structures that will be produced in this method in a desired location. Moreover, the tape/frame may be of a size and configuration that is compatible with a tape or frame carrier of a pick and place machine. In any case, the process may proceed to block 305 once the processed wafer has been mounted to a wafer frame and/or tape.

At block 305 (illustrated in element 405 of FIG. 4), the processed wafer may be diced into individual wavelength conversion elements. Dicing may occur by cutting the processed wafer along two axes (e.g., x and y axes) that bisect at least a portion of the pockets in the processed wafer. In the non-limiting example shown in FIG. 4, the processed wafer is diced in element 405 by cutting along first and second axes of symmetry in the pockets formed in the wafer. Such dicing may be performed via any suitable means, including mechanical cutting (e.g., with a diamond blade saw), laser cutting, or the like. In non-limiting preferred embodiments, each cut made during the dicing process extends through a plurality of pockets in the processed wafer. This concept is generally illustrated in element 405 in FIG. 4, wherein crosswise cuts made during dicing extend through a plurality of pockets formed in the processed wafer.

While FIG. 4 depicts an example wherein dicing occurs along one or more axes of symmetry that extend through pockets in the processed wafer, dicing in this manner is not required. For example, cuts made during dicing may occur through any portion of one or more pockets formed in the processed wafer. Moreover, cuts made during dicing need not extend through all pockets formed in a processed wafer, or even all pockets in a particular column or row of a processed wafer.

Figure 5:
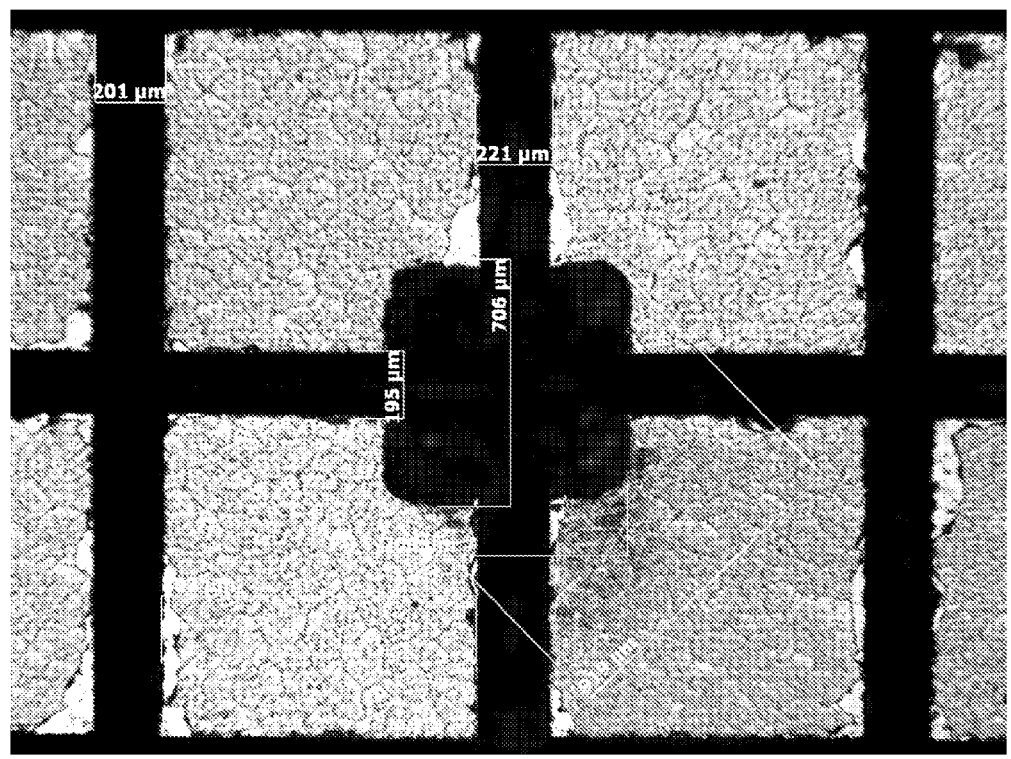
FIG. 5 is microscope image of exemplary thin film converters produced in accordance with the present disclosure.
Figure 6:
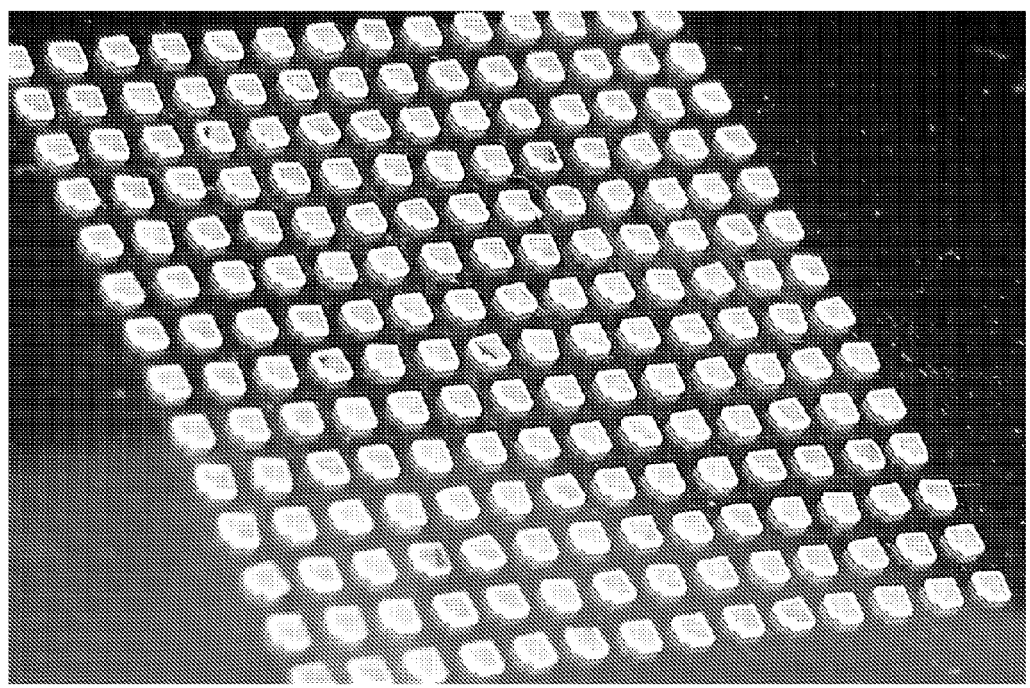
FIG. 6 depicts an exemplary array of thin film converters produced in accordance with the present disclosure, which have been sorted and oriented.

Once the process wafer is diced in accordance with bock 305, a plurality of thin film converters have been produced, and may be ready for transfer/mounting to a solid state lighting assembly. FIG. 4 illustrates the form of the thin film converters in element 406. FIG. 5. provides a microscope image of a plurality of thin film converters as produced by step 305 in accordance with the methods described herein. While the as-produced converters may be optionally reoriented after dicing step 305 (e.g., as shown in FIG. 6) such reorientation is not required.

At this point, the process may proceed to optional block 306, wherein the thin film converters may be transferred or otherwise mounted to a solid state lighting assembly using known procedures. For example, the thin film converters may be transferred or otherwise mounted to a LED assembly using known "pick and place" machines, such as a surface mount technology (SMT) component placement system. In non-limiting preferred embodiments, the thin film converters produced pursuant to blocks 301-305 are in a form that is compatible with a loading apparatus used in a pick and place machine. As used herein, the term "compatible with a loading apparatus used in a pick and place machine" means that the thin film converters produced in accordance with the methods described herein may be transferred or otherwise mounted to the loading apparatus without further modification to their structure or placement. In instances where a pick and place machine includes or utilizes a bulk loader, the thin film converters produced according to the present disclosure may be compatible with such a bulk loader.

As may be appreciated, the systems and methods of the present disclosure simplify the production of thin film converters for use in solid state lighting assemblies. Indeed, the methods described herein can produce an array of thin film converters arranged on a tape that is compatible with loading mechanism used in conventional placement machines, such as pick and place machines. Moreover, because the processes described herein can maintain the orientation of a wafer throughout production of the thin film converters, time consuming (potentially human) inspection of the thin film converters to ensure proper orientation is not required. In addition, the systems and methods described herein can permit the ready production of thin film converters that are compatible with a solid state lighting assembly, without significant retooling of the machinery used to produce the assembly. Thus for example, as the design of an LED package changes, thin film converters compatible with the redesigned package may be easily produced with the methods described herein.

Finally, while the design of an LED package may change rapidly, the nature of the wavelength converting structures used in such packages may not change. Thus, the methods described herein permit stockpiling of wafers having desired thin film conversion layers deposited thereon. When an LED package design is finalized or otherwise run, the stockpiled wafers may be readily processed into thin film converters using the methods descried herein.

According to one aspect of the present disclosure, a method of forming at least one wavelength converting structure for a wavelength converted light emitting diode (LED) assembly is provided. The method includes forming at least one pocket through a wavelength conversion plate capable of converting primary light emitted by said LED assembly to secondary light, and dicing the wavelength conversion plate by cutting through at least a portion of the at least one pocket, thereby forming the at least one wavelength converting structure.

In accordance with another aspect of the present disclosure, a method of forming a wavelength converted light emitting diode (LED) assembly is provided. The method includes forming at least one pocket through a wavelength conversion plate that is capable of converting primary light emitted by a light emitting surface of said LED assembly to secondary light. The wavelength conversion plate is then diced by cutting through at least a portion of the at least one pocket, thereby forming at least one wavelength conversion structure. The wavelength conversion structure is then positioned proximate to the light emitting surface such that at least a portion of the primary light emitted by the LED assembly is incident on a surface of the wavelength conversion structure.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method of forming at least one wavelength converting structure for a wavelength converted light emitting diode (LED) assembly, comprising:
    forming a wavelength conversion plate by depositing a first thin film of a wavelength conversion material directly on a first surface of a substrate that is at least partially transparent to primary light emitted by said LED assembly;
    forming an array of pockets in said wavelength conversion plate, said pockets extending through said first thin film of wavelength conversion material and said substrate, said wavelength conversion plate capable of converting primary light emitted by said LED assembly to secondary light; and
    dicing said wavelength conversion plate by cutting completely through said wavelength conversion plate along two axes, each axis, each axis bisecting each of said pockets, thereby forming said at least one wavelength converting structure wherein said at least one wavelength converter structure has a notch in one corner corresponding to a wire bonding pad of said LED assembly.

2. The method of claim 1, wherein the thin film of wavelength conversion material comprises at least one phosphor.

3. The method of claim 2, wherein the thin film of wavelength conversion material has a thickness ranging from about 200 nm to about 20 µm.

4. The method of claim 1, further comprising mounting said wavelength conversion plate on a frame prior to said dicing.

5. The method of claim 1, further comprising mounting said wavelength converting structure to a tape prior to said dicing.

6. The method of claim 1 wherein a second thin film of a wavelength conversion material is deposited directly on a second surface of said substrate such that said substrate is between said first and second thin films, and wherein said pockets further extend through said second thin film.

7. A method of forming a wavelength converted light emitting diode (LED) assembly, comprising:
   forming a wavelength conversion plate by depositing a first thin film of a wavelength conversion material directly on a substrate that is at least partially transparent to primary light emitted by said LED assembly;
   forming an array of pockets in said wavelength conversion plate, said pockets extending through said first thin film of wavelength conversion material and said substrate, said wavelength conversion plate capable of converting primary light emitted by a light emitting surface of said LED assembly to secondary light;
   dicing said wavelength conversion plate by cutting completely through said wavelength conversion plate along two axes, each axis bisecting each of said pockets, thereby forming said at least one wavelength converting structure wherein said at least one wavelength converter structure has a notch in one corner corresponding to a wire bonding pad of said LED assembly; and
   positioning said wavelength conversion structure proximate to said light emitting surface, such that said notch permits wire bonding to said wire bonding pad and at least a portion of said primary light is incident on a surface of said wavelength conversion structure.

8. The method of claim 7, wherein the thin film of wavelength conversion material comprises at least one phosphor.

9. The method of claim 7, wherein the thin film of wavelength conversion material has a thickness ranging from about 200 nm to about 20 μm.

10. The method of claim 7, further comprising mounting said wavelength conversion plate on a frame prior to said dicing.

11. The method of claim 7, further comprising, prior to said dicing, mounting said wavelength conversion plate to a tape.

12. The method of claim 11, wherein said dicing forms an array of wavelength conversion structures arranged on said tape.

13. The method of claim 12, wherein said positioning comprises using a surface mount technology (SMT) component placement system configured to pick said wavelength conversion structure after said dicing and place said wavelength conversion structure proximate to said light emitting surface.

14. The method of claim 13, wherein said SMT component placement system comprises a bulk loader, and said dicing forms an array of wavelength conversion structures that is compatible with said bulk loader.

15. The method of claim 7 wherein a second thin film of a wavelength conversion material is deposited directly on a second surface of said substrate such that said substrate is between said first and second thin films, and wherein said pockets further extend through said second thin film.

* * * * *